United States Patent [19]
Gershen et al.

[11] Patent Number: 5,499,155
[45] Date of Patent: Mar. 12, 1996

[54] CIRCUIT ANALYZING SYSTEM

[75] Inventors: Bernard Gershen, Centerport; Alfred J. Lombardi, LaGrangeville, both of N.Y.; James E. Meehan, Ste. Veronique, Canada; Saul Rosenbaum, East Meadow, N.Y.

[73] Assignee: Leviton Manufacturing Co., Inc., Little Neck, N.Y.

[21] Appl. No.: 373,684

[22] Filed: Jan. 17, 1995

Related U.S. Application Data

[63] Continuation of Ser. No. 1,885, Jan. 8, 1993, Pat. No. 5,383,084.

[51] Int. Cl.$^6$ ................................................ H02H 3/26
[52] U.S. Cl. ............................ 361/113; 361/85; 361/93
[58] Field of Search ............................ 361/113, 85, 93, 361/42; 324/128, 520

[56] References Cited

U.S. PATENT DOCUMENTS 5,383,084  1/1995  Gershen et al. ........................ 361/113

*Primary Examiner*—A. D. Pellinen
*Assistant Examiner*—Sally C. Medley
*Attorney, Agent, or Firm*—Paul J. Sutton

[57] ABSTRACT

A circuit analyzing system includes a current transformer for extracting current from a phase or neutral conductor of a three phase line, a filter connected to the output of the current transformer and functioning to substantially trap current at the fundamental frequency while substantially passing currents at various harmonic frequencies thereof, and signal processing circuitry connected to the output of the filter to perform various functions with the harmonic frequency current input thereto. Among these functions, as shown in various preferred embodiments, are measurement of the harmonic signal in RMS and conveyance of the output to a display instrument for a user or utility's convenience in monitoring harmonic frequency circuits, which have become more common with the advent of electronic equipment having internal power supplies such as personal computers, work stations, printers, and the like. Other functions include a user or utility's connecting a demand circuit mechanism to the measured currents (preferably RMS/harmonic frequency currents), and/or using comparator circuitry to sense the measured harmonic frequency currents and, if they exceed a desired level set by the user or utility, to output a signal to a tripping device such as a power contactor or relay which will in turn institute load shedding.

7 Claims, 5 Drawing Sheets

CIRCUIT ANALYZING SYSTEM

This Application is a continuation of application Ser. No. 08/001,885 filed Jan. 8, 1993 and now issued U.S. Pat. No. 5,383,084 issued Jan. 17, 1995.

BACKGROUND OF THE INVENTION

The invention relates to a system which will detect and measure the harmonic content of 60 Hz current.

A problem which is increasing in importance is the amount of harmonic current generated in branch circuits. Such harmonic current is produced by most electronic power supplies. With the ever increasing number of personal computers, work stations, printers, etc. connected to a user facility's power circuit, the level of harmonic current can overload branch circuit wiring. Also, excessive harmonic current is detrimental to efficient utility power transmission and distribution.

To more precisely describe the problem caused by harmonic current, power supplies for use in computers and other electronic equipment sometimes utilize power line current in a non-sinusoidal form. The result is that harmonic currents are taken from the power line. This phenomenon can be particularly bothersome with regard to the current in the neutral line of a 3 phase circuit. In such a circuit, the harmonics do not cancel each other out as do fundamental sine currents. The neutral line, if not designed to compensate for this harmonic current, may overheat. Also, the utility supplying the user may find that its station and substation equipment, as well as its neutral wire, (transmission and/or distribution) is undersized in view of the harmonic current.

This phenomenon is widespread because most buildings were designed before the proliferation of electronic equipment with power supplies such as hereinbefore described, and consequently they are vulnerable to circuit failure within the building.

To more fully describe the problem presented by currents and harmonic frequencies, and assuming a fundamental frequency of 60 Hz, the harmonics would be 120, 180, 240, 300, etc. Hz. In general, the problem is caused mainly by the "harmonics that are multiples of 3," i.e., 180, 360, 540, 720, etc. Hz. These harmonics do not cancel in the neutral conductor. Thus, if the wiring was originally "sized" for pure sine waves, as was the case before the proliferation of electric power supplies, the neutral conductor may be undersized for modern loads, such as p.c.s, terminals, workstations, printers, etc. Additionally, as previously implied, the utility generating and distributing equipment can be overheated by the harmonic content of the load currents.

A similar problem exists with regard to the utility in that it would like to be able to measure and detect harmonic current and thus produce or buy equipment to take care of the problem. The benefit to the utility would lie in its ability to charge customers for remedying the problems caused by this harmonic current.

SUMMARY OF THE INVENTION

A primary object of the invention is to provide an economical means for measuring harmonic frequency currents within branch circuits of a system and, if desirable, either disconnecting the circuits by means of load shedding and/or having the supplying electric utility charge a premium for excessive demand caused by harmonic frequency currents in a user's branch circuits.

This and other objects of the present invention are achieved by the system of the present invention which comprises a filter circuit connected to the neutral conductor of a 3 phrase circuit having loads of the type hereinbefore described, wherein the filter circuit connected to the neutral conductor is basically a 60 Hz trap which substantially eliminates 60 cycle current and also functions to substantially pass higher harmonic frequency currents, i.e., it rejects or reduces currents by 60 decibels(db.) at 60 Hz and less than one db. at 180 Hz and the higher harmonic frequencies, i.e. 240 Hz, 300 Hz, and 360 Hz, etc.

More specifically, the filter circuit of the present invention comprises the aforementioned 60 Hz trap filter whose input is connected to a current transformer which measures neutral current and conveys it to the 60 Hz trap filter which extracts energy at all frequencies above the fundamental frequency of 60 Hz as previously described. These extracted harmonic currents are summed in a signal processor of some type (preferably in a root mean square or RMS type device). The information thus obtained is then available for a display to indicate RMS neutral conductor current. Also, the information (harmonic RMS current) can be summed over a fixed time by a demand meter such that a utility can use the demand meter information to collect additional revenue from customers with excessive harmonic generation. Also, the output available from the signal processing circuitry can be used to shed loads for particularly high harmonic current situations.

On the other hand, the same type of circuit could be used by a power consumer in order to determine which equipment and/or branch circuit generates the most harmonic current. Such information could then be used by the consumer to install filters such as inductors or other electric means to reduce the harmonic content of the current received from the utility.

In a preferred embodiment, the filter circuit could comprise a Twin-T filter, although other preferred embodiments contemplate the use of other types of filters.

DESCRIPTION OF THE PREFERRED EMBODIMENTS

Figure 1:
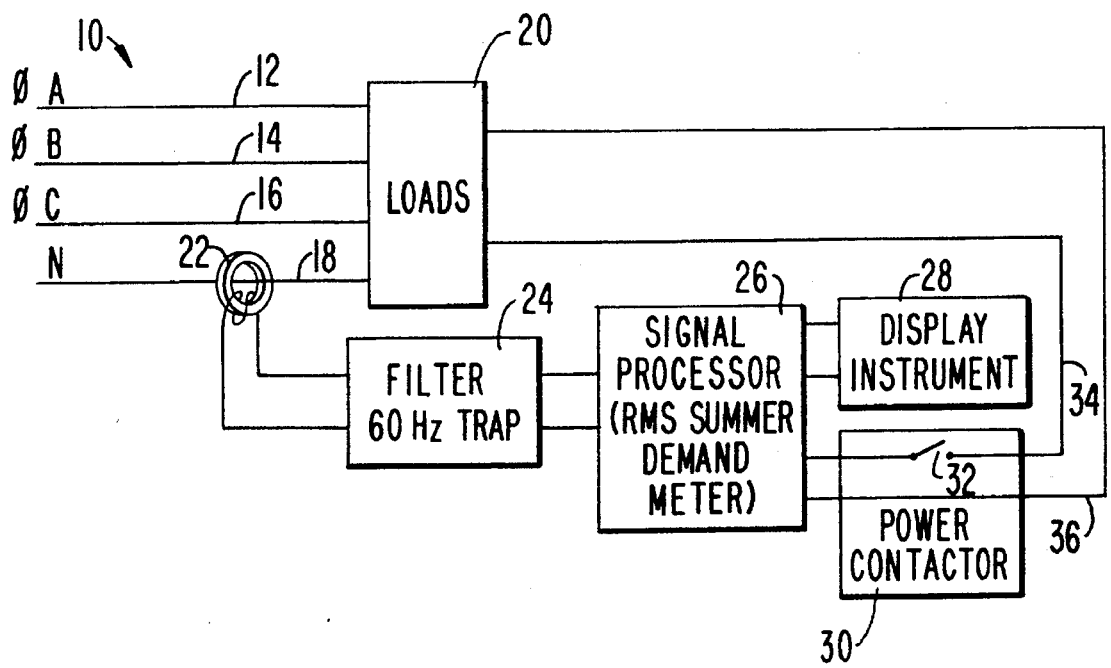
FIG. 1 is a general schematic of the circuit analyzing system of the present invention.

FIG. 1 is a general schematic of the circuit analyzing system of the present invention. The system is generally identified by reference number 10. As shown therein, input phase lines 12, 14 and 16, as well as neutral line 18, are connected to loads 20. Connected to neutral line 18 is transformer 22 which measures neutral current. The output therefrom is conveyed to filter 24 which extracts energy at all frequencies above the fundamental frequency (60 Hz in the U.S.). The odd harmonic frequencies (i.e., 180 HZ, 300

HZ, etc.) thus extracted are summed, preferably in a root mean square (RMS) scaled mechanism, which forms part of the signal processing block 26 shown in FIG. 1. This information is then available to be conveyed to display apparatus 28 which can indicate the RMS neutral line current. These harmonic current frequencies can be summed within the signal processing module 26 by a demand mechanism. In this particular instance, since the demand circuit mechanism is attuned to summing harmonic current, it can be used by the utility to collect revenue from customers with excessive harmonic current generation.

In addition to the use of the circuit system of FIG. 1 by a utility, such a circuit can be used by a power consumer in order to determine which equipment and/or branch circuit is generating the most harmonic current. This information could then be used by the consumer to install filters such as inductors or other electronic means to reduce the harmonic content of the current taken from the utility.

Figure 5:
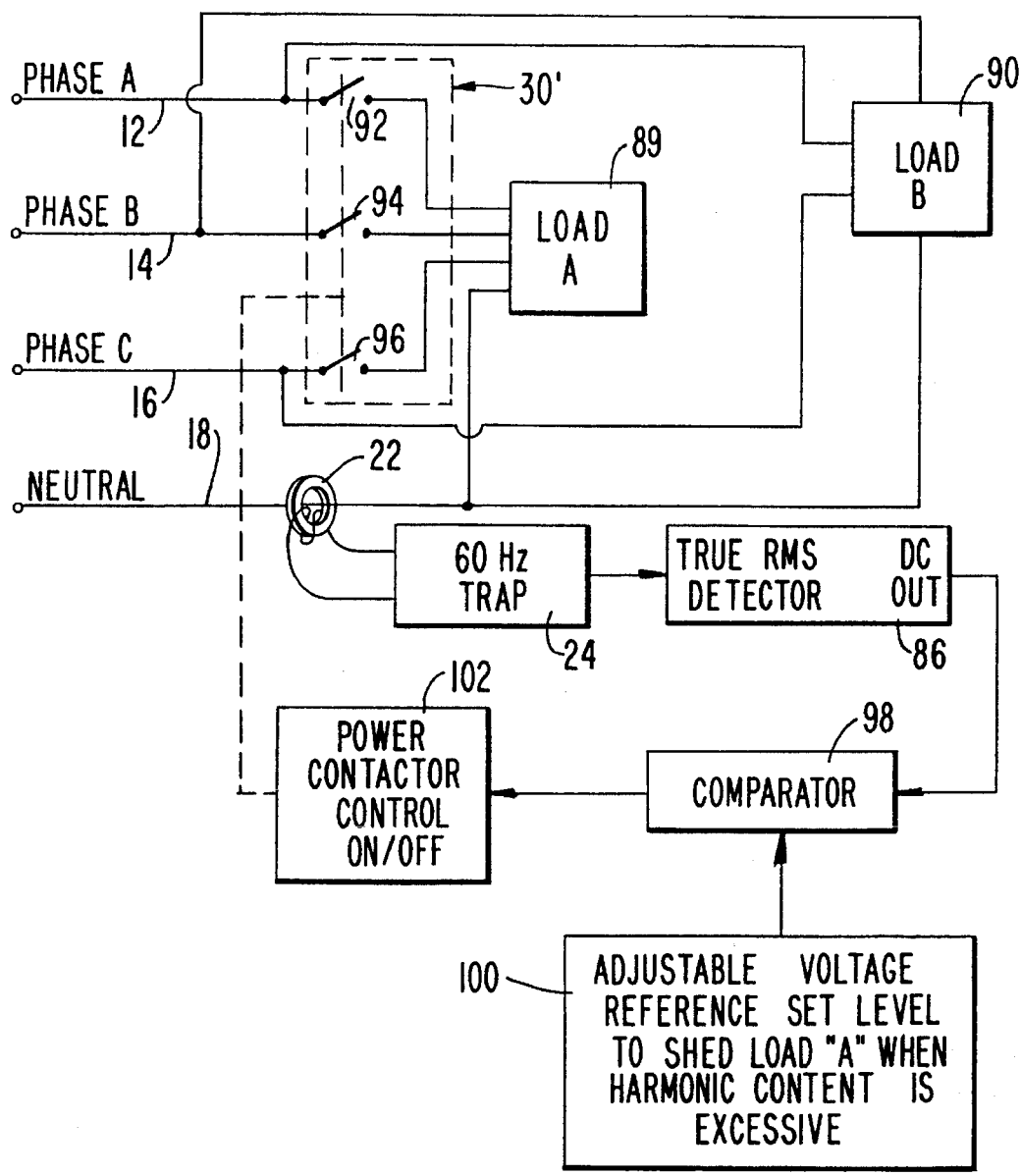
FIG. 5 is a schematic of yet another embodiment of the circuit analyzing system of the present invention.

Yet another application of the circuit analyzing system of FIG. 1 is to convey the summed harmonic current to load shedding elements such as power contactor 30 in the event that the harmonic current generated is so large as to endanger the power continuity to other parts of the system. As shown in FIG. 5, power contactor 30' has contacts such as contacts 92, 94 and 96 which contacts can be used to respectively open lines 12, 14, and 16 in the event of harmonic current overload upon a signal from power contactor control on/off 102.

Figure 2:
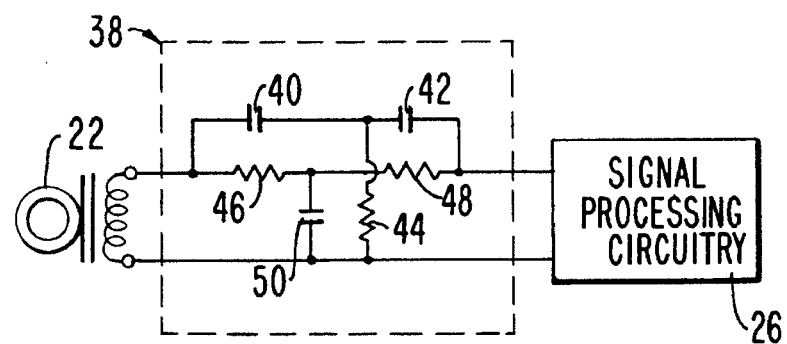
FIG. 2 is a schematic of a preferred embodiment of the filter circuit of the circuit analyzing system of FIG. 1.

FIG. 2 shows an embodiment of the circuit analyzing circuit of FIG. 1 using a Twin-T circuit. This Twin-T circuit, generally designated with reference numeral 38, comprises one T network including capacitors 40 and 42 as well as resistor 44. A second T network connected in parallel therewith comprises resistors 46 and 48 as well as capacitor 50. The network functions such that, if the reactance and resistances are properly chosen, these networks may be used to pass through or reject a particular frequency. In the present application of course they are used to substantially reject the fundamental frequency (60 Hz) and to substantially pass therethrough the aforementioned harmonic frequencies.

The advantages for using a Twin-t filter are those of component cost and size. At 60 Hz, inductors such as would be used in a conventional LC filter are large and expensive. The Twin-T circuit uses only resistors and capacitors. The basic resonant equation uses the product of "RC" and therefore large values of "R" can be used with small values of "C" to give a low frequency.

Figure 3:
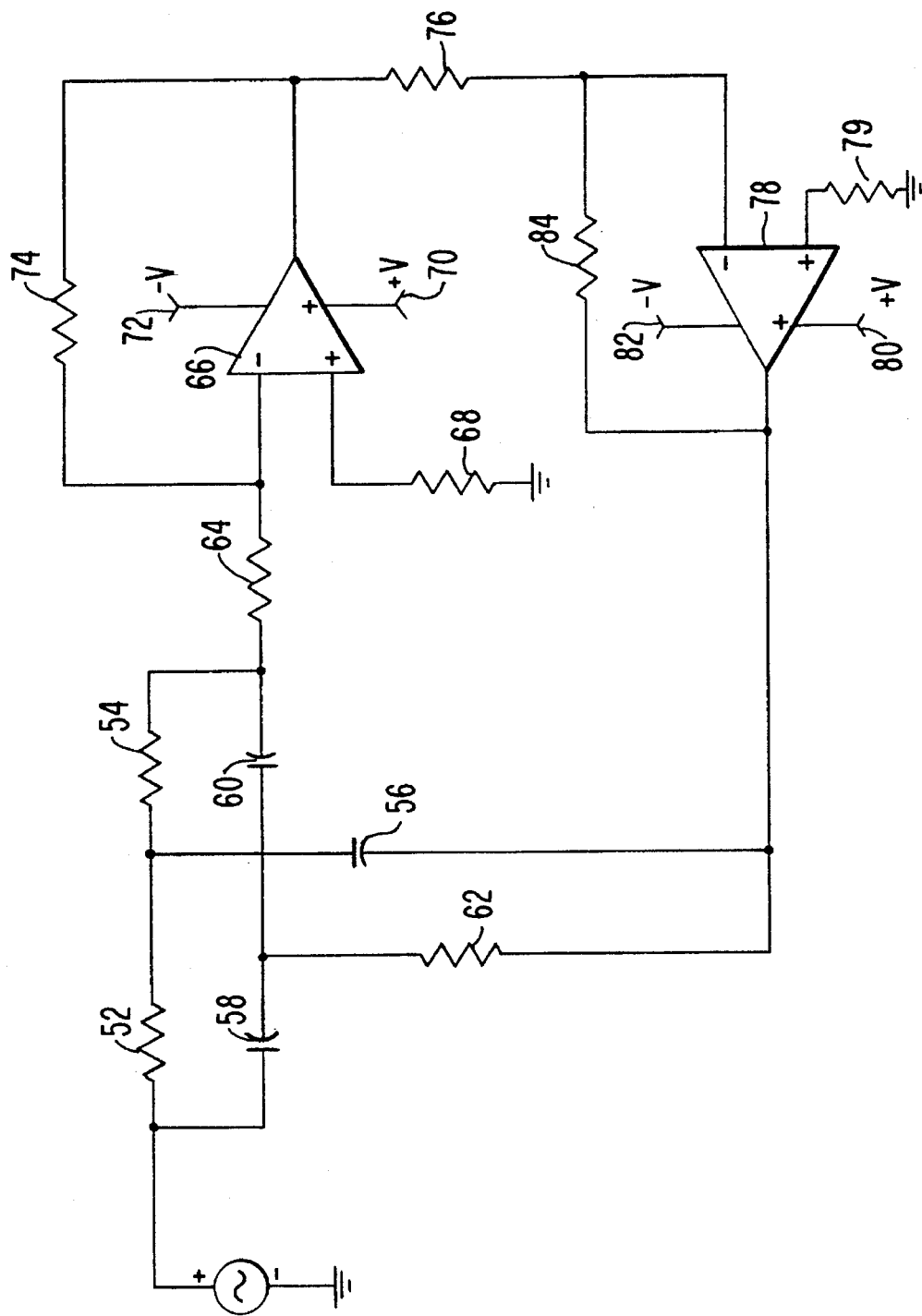
FIG. 3 is a schematic of another preferred embodiment of the filter circuit of FIG. 1.

FIG. 3 shows a preferred embodiment of the invention wherein a sharper (narrower) frequency response curve is achieved by combining operational amplifiers with a Twin-T circuit. As shown therein, the circuit comprises a "Single-T" arrangement showing resistors 52 and 54, together with capacitor 56. This circuit is arranged in parallel with the other "T" arrangement comprising capacitors 58 and 60 together with resistor 62. The harmonic signal is then conveyed from the Twin-T network through resistor 64 to operational amplifier 66 which has its positive input terminal connected through resistor 68 to ground and has positive and negative voltage outputs 70 and 72, and has resistor 74 connected in parallel therewith. The output of operational amplifier 66 is connected through resistor 76 to the negative terminal of operational amplifier 78 which has its positive terminal connected to ground through resistor 79 and has positive and negative voltage outputs 80 and 82, and has resistor 84 connected in parallel therewith. The output of the operational amplifier 78 is connected to the Twin-T network through resistor 62 and capacitor 56 to feedback a signal thereto. As stated previously, a sharper frequency response i.e., a more "narrow" frequency curve is achieved by this combination of operational amplifiers with the Twin-T network.

Figure 4:
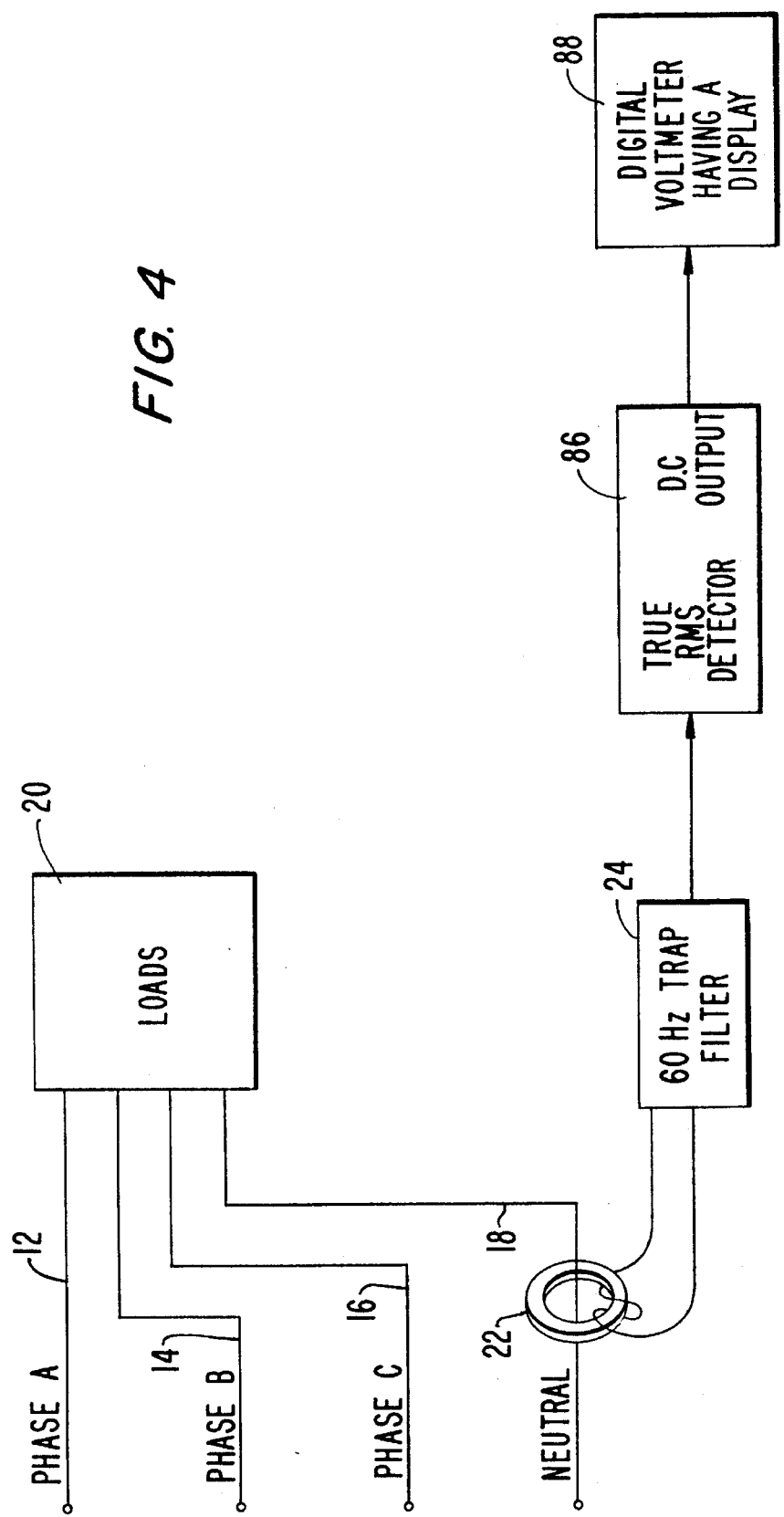
FIG. 4 is a schematic of another preferred embodiment of the circuit analyzing system of the present invention.

FIG. 4 shows one preferred embodiment of the circuit analyzing system shown generally in FIG. 1. In this embodiment current transformer 22 is connected to neutral line 18 and conveys current to 60 Hz trap filter 24 which substantially blocks 60 Hz frequency signals but substantially passes all harmonic signals. These signals are conveyed to a true RMS detector 86 which has a DC output connected to a digital voltmeter and display 88. Consequently, a user or a supplying utility can obtain a direct readout of the harmonic current in a specific neutral line. It should be noted that the current in any other line can be analyzed by threading the wire carrying the current through current transformer 22. Also, other means can be used for detecting the current than the current transformer, and the current transformer 22 does not have to be a toroid but can be another transformer configuration.

FIG. 5 shows another preferred embodiment of the circuit analyzing system of the present invention. In this embodiment the harmonic current to separate loads 89 and 90 can be monitored by using separate phase connections to respective loads 89 and 90 and using switches 92, 94 and 96 to facilitate the desired connection between respective phase lines 12, 14 and 16 to respective loads 89 and 90. This circuit includes, as does the circuit of the previous preferred embodiments, a current transformer 22 connected to neutral line 18 and 60 Hz trap filter 24 which substantially blocks 60 Hz transmission and outputs only current at substantially harmonic frequencies. These harmonic frequencies are conveyed through RMS detector 86 which has a DC output connected to a comparator 98. The comparator 98 has a voltage reference input 100 which is preset at a level to shed load 89 when the harmonic current is excessive. This load shedding is accomplished by power contactor 30' consisting of contacts 92, 94, and 96 which open these contacts in response to the signal from power contactor control 102, thus cutting off current to load 89 when the harmonic content is excessive. This phenomenon occurs when the output of the true RMS detector 86 exceeds the voltage reference input from module 100, which voltage reference can be set by the utility or the user. Then the power contactor control 102 goes into a control "off" mode and causes contactor 30' to open the contacts 92, 94 and 96 as hereinbefore explained.

Figure 6:
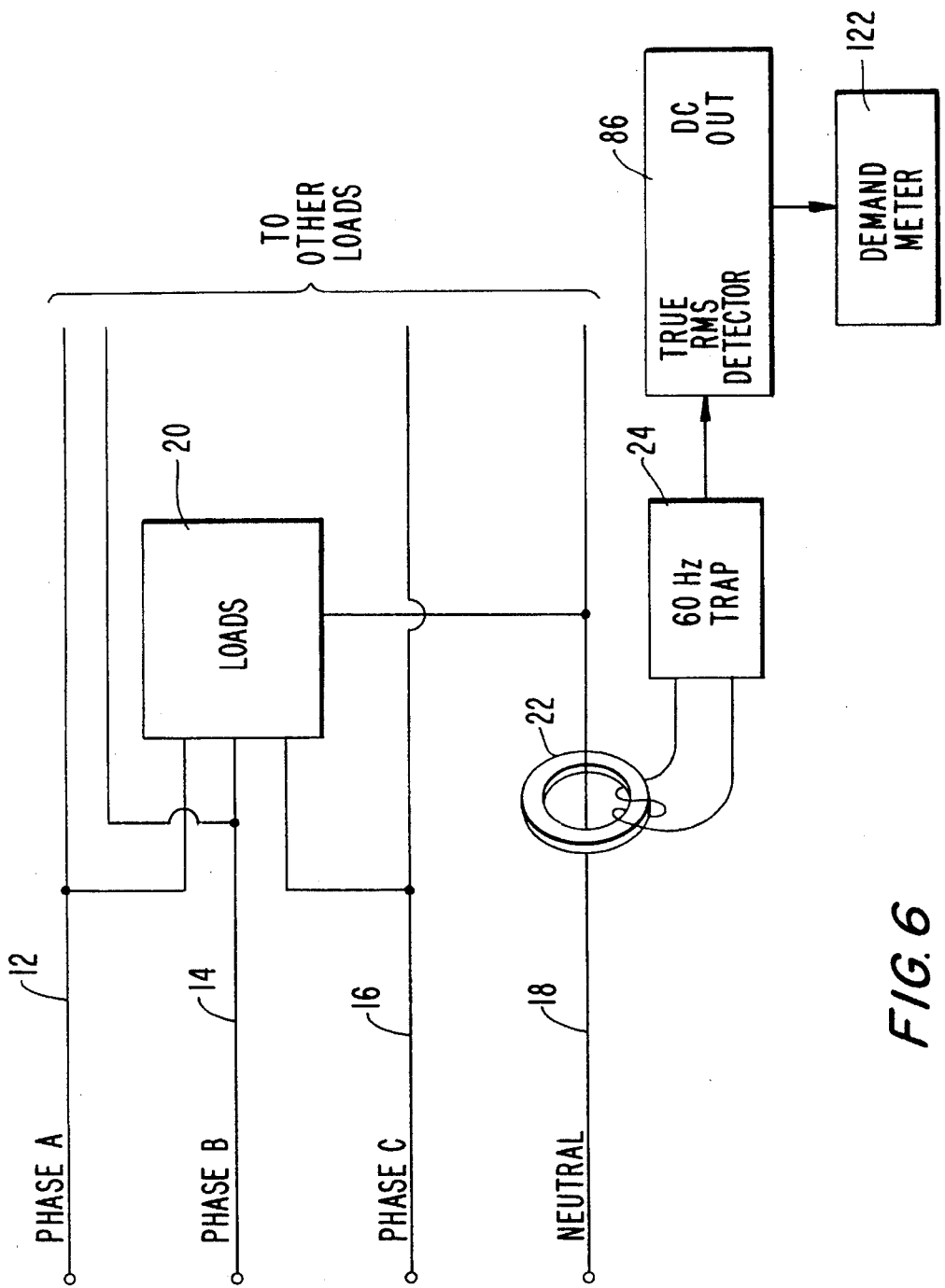
FIG. 6 is a schematic of still another embodiment of the circuit analyzing system of the present invention.

The preferred embodiment of FIG. 6 contemplates use by a electric utility to determine excessive harmonic content in the signals it is supplying over relatively short periods of time during a utility billing cycle. In this embodiment, as in the previous embodiments, a current transformer 22 senses current in the neutral line 18 and conveys it to a 60 Hz trap filter 24 which removes the 60 Hz signal and extracts the harmonics thereof. The harmonic components of the current are conveyed to a true RMS detector 86 which in turn conveys current to a demand meter 122. The demand meter 122, which is calibrated in ampere-hours determines harmonic current for a preset period of time, for example 1 hour. At the end of the testing period, the total ampere-hours are compared with the ampere-hours from the previous hour. The higher of these two values is then stored to be compared to the ampere-hours of the next hour. The ampere-hour measuring instrument is then reset to zero and a new cycle begins. In this manner, at the end of the billing period, the utility knows the maximum usage of harmonic currents and can bill accordingly.

It will be appreciated that variations and alterations to the disclosed preferred embodiments of the invention can be made without parting from the spirit and scope of the invention.

We claim:

1. A circuit analyzing system comprising:
   a) a first load to be supplied with current from an AC power supply;
   b) a second load to be supplied with current from the same AC power supply;
   c) three phase conductors and one neutral conductor connecting said AC power supply to said first and second loads;
   d) means in said three phase conductors to open said three phase conductors to one of said first and second loads in response to an actuation signal;
   e) means for extracting current from said neutral conductor;
   f) filter means connected to said means for extracting current and functioning to substantially block the passage of fundamental frequency current, and to substantially pass harmonic frequency currents therethrough;
   g) signal processing means connected to an output of said filter means and functioning to add said harmonic frequency currents together and to generate a signal representative of the total amount of harmonic frequency currents;
   h) means for generating a variable voltage reference signal;
   i) a comparator coupled to said signal processing means to receive said signal and to said means for generating to receive said variable voltage reference signal;
   j) said comparator generating an actuation signal if said signal representative of the total amount of harmonic currents exceeds a predetermined value; and
   k) coupling means connecting said comparator to said means to open to cause said means to open to open said three phase conductors in response to an actuating signal from said comparator.

2. A circuit analyzing system, as defined in claim 1, wherein said means to open said three phase conductors opens said conductors to interrupt the supply of current to said first load.

3. A current analyzing system, as defined in claim 1, wherein said means to open said three phase conductors opens said conductors to interrupt the supply of current to said second load.

4. A circuit analyzing system, as defined in claim 1, wherein said means to open said three phase conductors comprises a contactor.

5. A circuit analyzing system, as defined in claim 1, wherein said means to open said three phase conductors comprises a protective relay.

6. A circuit analyzing system, as defined in claim 1, wherein said signal generated by said signal processing means is a D.C. signal.

7. A circuit analyzing system, as defined in claim 1, further comprising:
   a) control means for operating said means to open;
   b) said coupling means having a first portion between said comparator and said control means; and
   c) a second portion between said control means and said means to open.

* * * * *